United States Patent
Sogard

(10) Patent No.: US 9,513,460 B2
(45) Date of Patent: Dec. 6, 2016

(54) APPARATUS AND METHODS FOR REDUCING AUTOFOCUS ERROR

(71) Applicant: Nikon Corporation, Chiyoda-ku (JP)

(72) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 499 days.

(21) Appl. No.: 13/793,507

(22) Filed: Mar. 11, 2013

(65) Prior Publication Data

US 2014/0036245 A1 Feb. 6, 2014

Related U.S. Application Data

(60) Provisional application No. 61/678,553, filed on Aug. 1, 2012.

(51) Int. Cl.
| | | |
|---|---|---|
| *G03B 27/68* | (2006.01) | |
| *G02B 7/09* | (2006.01) | |
| *G02B 7/32* | (2006.01) | |
| *G03F 9/00* | (2006.01) | |

(52) U.S. Cl.
CPC . *G02B 7/09* (2013.01); *G02B 7/32* (2013.01); *G03F 9/7026* (2013.01)

(58) Field of Classification Search
CPC .......................... G03F 7/70191; G03F 9/7026
USPC ............ 355/52, 53, 55–56, 67; 356/399–401
See application file for complete search history.

(56) References Cited

U.S. PATENT DOCUMENTS

| | | |
|---|---|---|
| 5,602,399 A | 2/1997 | Mizutani |
| 6,320,658 B1 * | 11/2001 | Mizutani ...................... 356/399 |
| 7,940,374 B2 | 5/2011 | Lyons |
| 7,982,884 B2 * | 7/2011 | Smith .......................... 356/622 |
| 2008/0144023 A1 * | 6/2008 | Shibata ................. G01N 21/21 356/237.2 |
| 2011/0071784 A1 | 3/2011 | Smith et al. |
| 2012/0008150 A1 | 1/2012 | Smith et al. |

* cited by examiner

*Primary Examiner* — Hung Henry Nguyen
(74) *Attorney, Agent, or Firm* — Klarquist Sparkman, LLP

(57) ABSTRACT

In a lithography tool used in fabricating microelectronic devices, autofocus (AF) systems provide automatic image focusing before making exposures. To reduce production of erroneous results based on interaction of a beam of AF light with certain regions on lithographic substrates, a subject AF device has a sending unit and a receiving unit. The sending unit directs an AF light beam to the substrate, and the receiving unit receives AF light reflected from the substrate. The receiving unit has a system photodetector and a patterned optical element that receives AF light from the substrate and transmits a selected diffraction order(s) of said light. The system photodetector senses light of the selected diffraction order of reflected AF light while at least one additional photodetector detects divergent reflected AF light. Substrate areas exhibiting unusual amounts of divergent light may indicate a focus-error condition. The AF systems can be configured as fringe-projection or slit-projection AF systems.

29 Claims, 13 Drawing Sheets

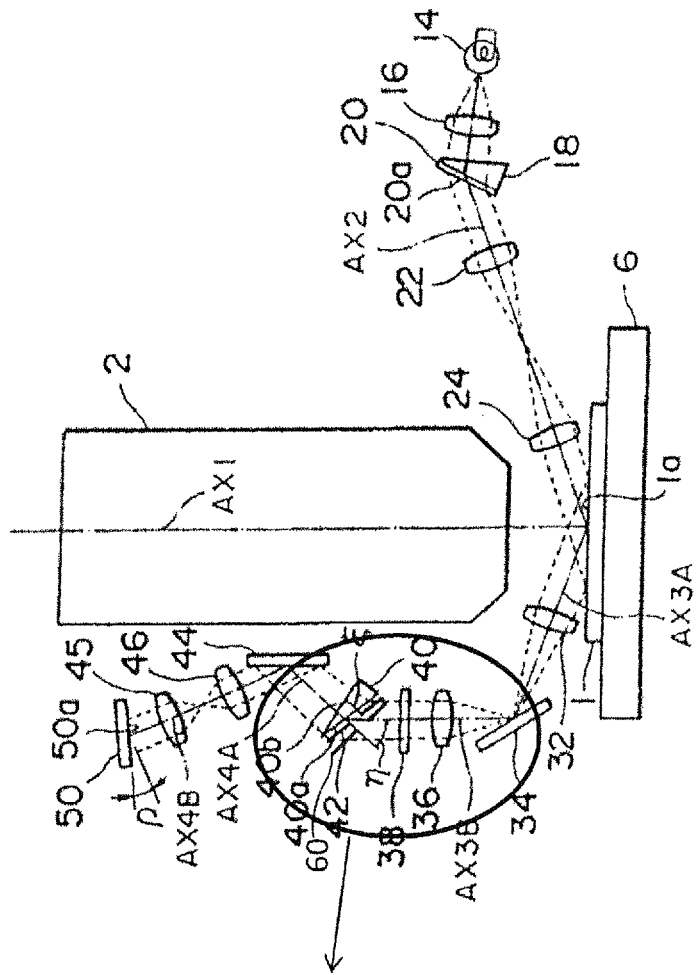
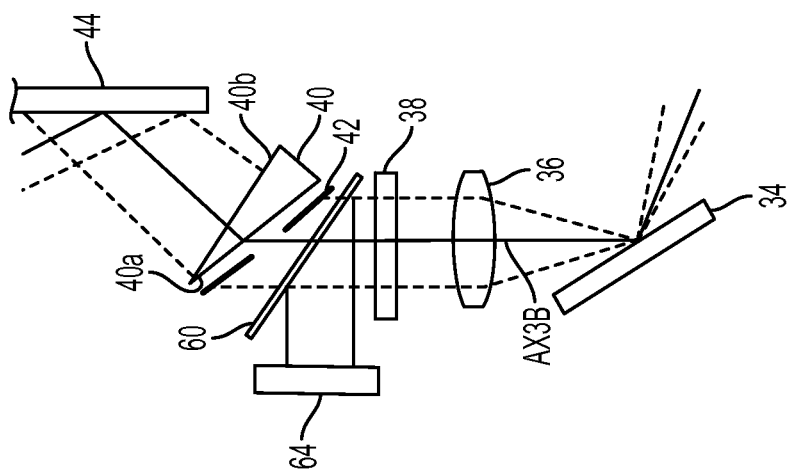
FIG. 7B
FIG. 7A

APPARATUS AND METHODS FOR REDUCING AUTOFOCUS ERROR

CROSS-REFERENCE TO RELATED APPLICATION

This application claims priority to, and the benefit of, U.S. Provisional Application No. 61/678,553, filed Aug. 1, 2012, which is incorporated herein by reference in its entirety.

FIELD

The disclosure pertains to, inter alia, identification and reduction of autofocus errors in high-resolution lithography.

BACKGROUND

Modern lithography tools require extremely accurate placement of the lithographic substrate (e.g., a semiconductor wafer) relative to the imaging optical system to ensure optimum focus of the images formed on the substrate surface by the imaging optical system. Also, current demands on throughput require that any focus adjustments from one exposure to the next be performed extremely rapidly (and hence automatically).

During manufacture of microelectronic devices, multiple lithographic steps are required to form the multiple circuit-defining, thin-film layers of the devices. The various layers thus formed typically have different patterns of circuit elements. Autofocus (AF) devices in current lithography tools are usually located in the vicinity of the substrate and imaging optical system and usually involve directing a beam of light (called AF light) at a region of the substrate at a glancing angle of incidence. The AF light can be, for example, an image of a slit or a set of interference fringes. The AF light reflected from the substrate surface is electronically detected and analyzed, and the resulting data are used for positioning the substrate relative to the imaging optical system. AF devices can work in conjunction with other devices for detecting and adjusting substrate "height" relative to the imaging optical system.

AF devices can produce erroneous substrate-height data due to thin-film effects occurring in the multiple layers of material already formed on the substrates. In other words, the devices can be adversely affected by the optical properties of the substrate surface and underlying structures, such as layers (usually but not necessarily patterned layers) already formed on the substrate during earlier process steps. Light reflected from the substrate frequently exhibits changes in intensity and/or phase that are unrelated to actual substrate height. An AF device may produce a height estimate including errors related to these changes, particularly changes that are non-linearly related to the thicknesses and refractive indices of the underlying layers. These errors are termed "AF errors" or "focusing errors."

An important source of AF errors arises from some of the AF light (which may form images of "slits" or "fringes" on the substrate) reflecting from previously formed patterned thin films beneath the surface of the substrate. The magnitude of AF errors of this general type can vary with the particular pattern(s) and other features in the previously formed layers on the substrate, and can vary with the thickness profiles of those layers. These AF errors can be substantial.

An example AF error arising from the presence of thin-film layers previously formed on the substrate is the Goos-Hanchen (GH) effect, in which a substrate surface including thin films formed during earlier process steps produces a shift or offset in position of a beam of light reflected from the surface. This shift is not related to an actual change in position of the substrate, but can be mistaken for one. Patterning in previously formed thin films is not required for the GH effect to occur (but patterning can be a factor). Rather, the simple presence of the previously formed thin films is required. If the substrate has the same thin-film stack applied uniformly over the substrate surface, then the result usually is a substantially uniform GH effect and produces a uniform offset that is easily treated by introducing an offset from the measured substrate height. Otherwise, GH effects can vary appreciably over the substrate surface, depending upon regional variations of thickness and other parameters of the thin films over the surface as well as pattern variations from one region to the next. For example, a change in regional offset due to the GH effect can arise in a substrate area containing memory circuits relative to another area containing logic circuits. Also, different patterns, although they may consist of the same material, may produce different offsets from GH effects by virtue of the structures, spatial frequencies, orientation, duty cycles, etc., of the respective patterns relative to other patterns.

In producing a GH effect, previously formed layers on the substrate surface can change the intensity of reflected AF light and/or the phase of that light. According to one way of looking at the GH effect, a monochromatic AF beam incident on a reflecting surface can be decomposed into multiple plane waves. The reflective surface (i.e., the substrate surface) produces a different phase for each of these plane waves, depending on the wave's angle of incidence. Over a small range of incidence angles (corresponding to a converging or diverging wavefront), the phase of reflection can either increase or decrease with the angle of incidence, which produces a tilted wavefront in the far field corresponding to a physical shift of the beam in the near field. The GH effect is the apparent shift of the beam, which is manifest as an AF error.

Correction of an AF error caused by the GH effect is called a Goos-Hänchen correction (GHC). An example GHC is discussed in U.S. Patent Publication No. 2011/0071784 (called herein the "'784 reference"), incorporated herein by reference to the fullest extent allowed by law. The '784 reference discusses a fringe-projection AF device in which broadband AF light (having variable wavelength and polarization) is reflected from a substrate and detected along with AF light reflected from a reference mirror. GH effects, assumed to be present, are estimated from measured changes in spectral and polarization properties of the light reflected from the substrate on which a "stack" of previously formed layers has been formed. For example, the spectral and polarization properties may include a change in the change of phase with respect to the angle of incidence (and position on the substrate). The GH estimates thus obtained are used to estimate corresponding GHC's. Another conventional GHC is discussed in U.S. Patent Application Publication No. 2012/0008150, also incorporated herein by reference to the fullest extent allowed by law. Unfortunately, conventional slit- and fringe-projection AF devices still exhibit pattern-dependent phase changes to the AF light.

SUMMARY

Methods and systems are disclosed that permit identification of substrate areas for which fringe-projection and other optical AF devices tend to exhibit autofocus errors. Based on identification of potential errors, alternative focus approaches can be implemented based on data from, for example, physical sensors or by calculating substrate properties based on substrate structure.

An exemplary embodiment of an autofocus system comprises a sending unit including a first spatial filter. The embodiment also comprises a receiving unit that includes a system photodetector and at least one additional photodetector. The sending unit directs an AF light beam to a substrate, and the receiving unit receives AF light propagating from the substrate. The receiving unit comprises a patterned optical element that receives AF light from the substrate (including AF light that was scattered, diffracted, and/or refracted by the substrate; so-called "divergent" light). The patterned optical element divides the received AF light into a selected first part that propagates to the system photodetector and a separate second part that is detected by the at least one additional photodetector (not by the system photodetector). The first part of the light ideally is that light reflected from a flat, perfectly reflecting substrate; such light is referred to as "regular" light. Under certain conditions involving the previously formed layers on the substrate, the second part of the received AF light may include significant (or significantly changed) levels of divergent light, at least suggesting that the particular region of the substrate from which the AF light is reflecting at that moment may be producing an AF error.

The autofocus system can be configured as a fringe-projection AF system or slit-projection AF system. In a fringe-projection configuration, the patterned optical element desirably is configured as a second spatial filter that defines one or more apertures arranged to transmit at least one selected diffraction order of AF light reflected from the substrate. As an example of its configuration for use in fringe-projection AF systems, the aperture(s) transmit to the system photodetector at least one of the +1 and −1 diffraction orders of AF light reflected from the substrate while other diffraction orders are substantially not transmitted. (Other diffraction order(s) alternatively can be selected for transmission to the system photodetector, subject to the particular order(s) transmitted by the first spatial filter, such as but not limited to the $0^{th}$ order, the +1 order, and/or the −1 order.) In many embodiments the additional photodetector (s) is situated on or at an upstream-facing surface of the second spatial filter in a location not defining an aperture. In other embodiments the additional photodetector(s) is located such that light intended to be incident on it is reflected from the second spatial filter.

Many embodiments further comprise first and second pupils, wherein the first pupil is located upstream of the substrate, the second pupil is located downstream of the substrate, the first spatial filter is located at the first pupil, the second spatial filter is located at the second pupil, and the second spatial filter defines at least one aperture situated to transmit the selected diffraction order(s) of AF light, reflected from the substrate, to the system photodetector.

In many embodiments the at least one additional photodetector comprises a first detector and a second detector, located on or near the surface of the second spatial filter. These additional photodetectors are situated to detect AF light including AF light that was scattered, diffracted, or refracted by the substrate and not transmitted by the apertures.

The patterned optical element can be reflective. In embodiments of this type, the reflective optical element can define one or more apertures arranged to transmit at least one selected diffraction order of AF light reflected from the substrate (e.g., at least one of the +1 and −1 diffraction orders). Selected region(s) of the reflective optical element other than the apertures reflect AF light that has been scattered, diffracted, or refracted from structures and thin films on the substrate. The embodiments desirably further comprise an intermediate photodetector that receives AF light reflected from the reflective optical element. Particularly if the reflective optical element is planar, the AF system can further comprise a lens situated between the reflective optical element and the intermediate photodetector.

The subject AF systems can be configured such that the receiving unit comprises a slit plate, wherein the patterned optical element is situated upstream of the slit plate.

Other features and advantages will become more apparent from the following detailed description, which proceeds with reference to the accompanying figures.

BRIEF DESCRIPTIONS OF THE DRAWINGS

FIG. 7A is an optical diagram of a representative embodiment of an AF device placed in an exemplary lithography tool, the AF device being configured to direct divergent AF light to a second photodetector for determination of potential autofocus errors.

FIG. 7B is a closer view of a region denoted in FIG. 7A.

DETAILED DESCRIPTION

Figure 1A:
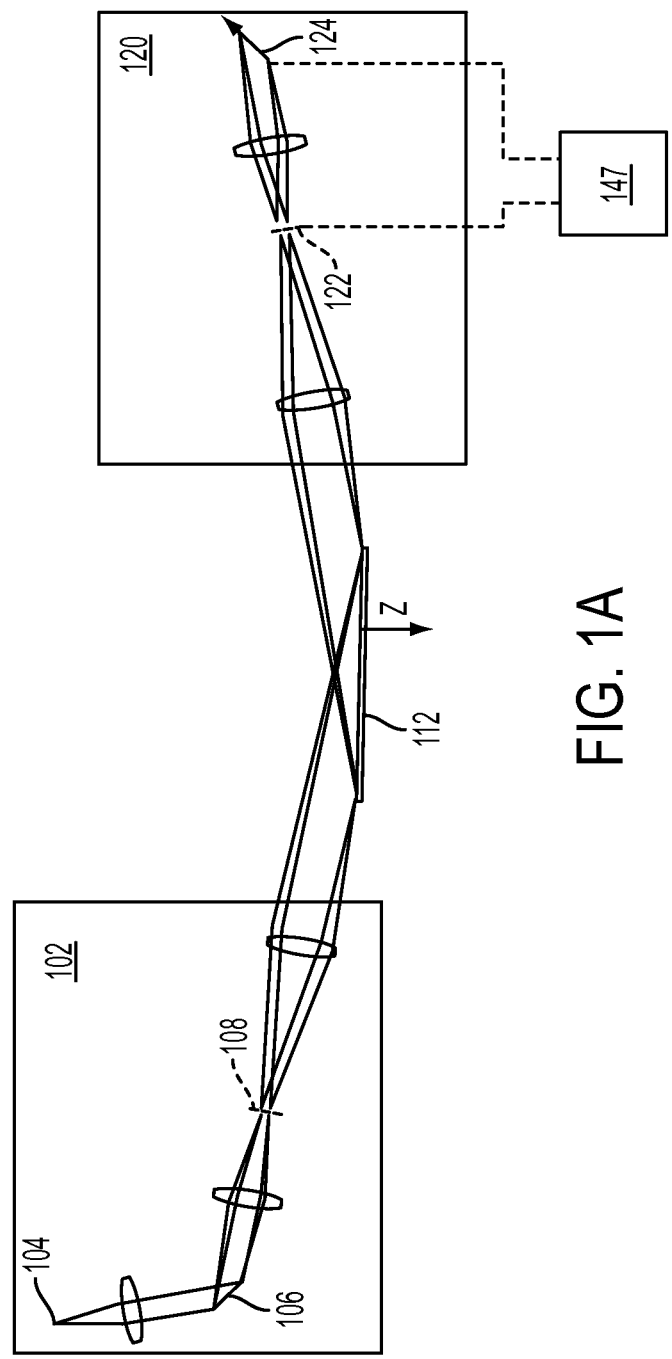
FIG. 1A is an optical diagram of a first representative embodiment of a fringe-projection AF device that includes, in addition to a system photodetector, additional photodetectors located at a second spatial filter in the receiving unit thereof.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Microlithography is a technology by which various thin-film layers of various materials are formed on the surfaces of substrates. Some of the layers may not be patterned, but most are. As layers are progressively formed on the substrate surface, the respective patterns in various layers become interconnected in 3-dimensional space. As microlithography has evolved to meet ever-tightening demands of continuing miniaturization of pattern features formed by this technology, many processes performed by microlithography tools have become increasingly sensitive to extraneous influences. An example is autofocus (AF), performed by one or more devices that determine the position (usually a vertical position) of the substrate relative to the imaging optical system of the tool.

Figure 11:
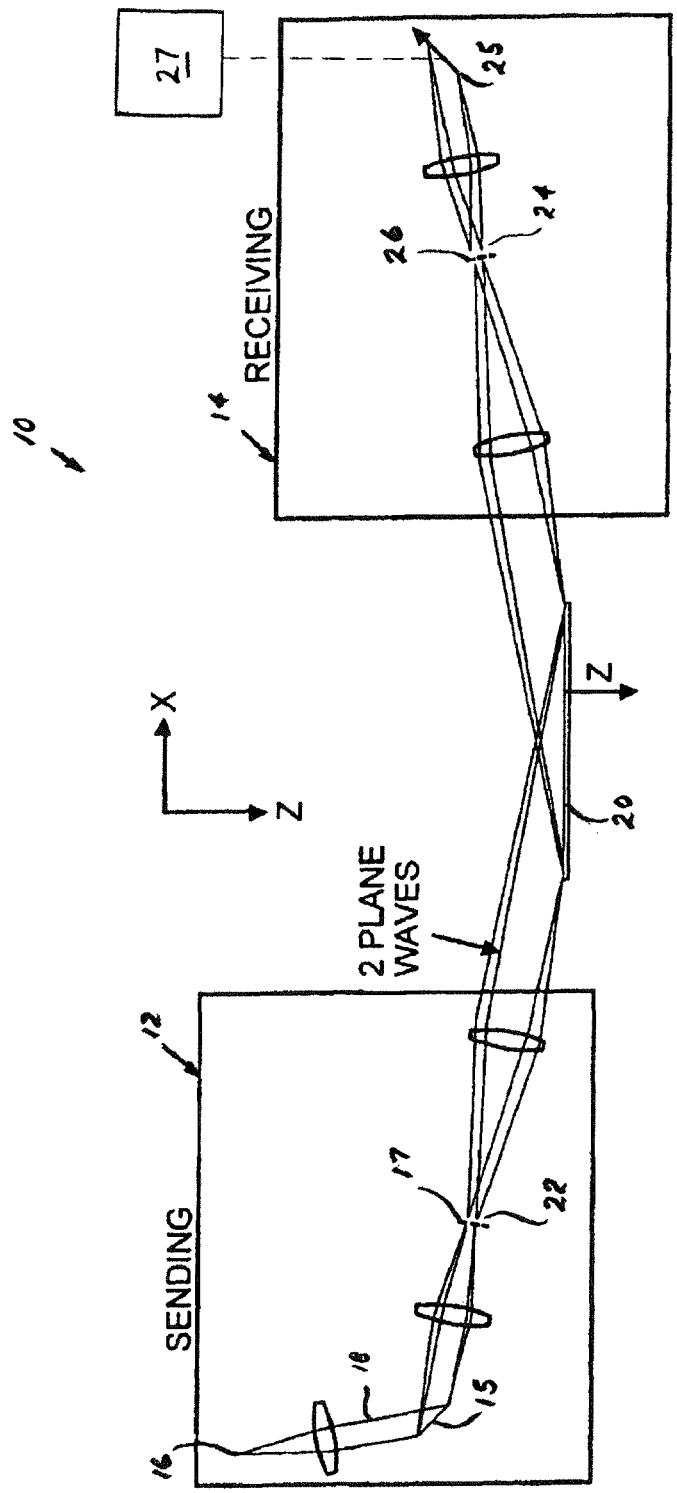
FIG. 11 is an optical diagram of a conventional fringe-projection AF system.

Autofocus devices in microlithography tools produce autofocus (AF) signals based on reflection of at least one "autofocus" light beam (termed AF beam or AF light) from regions of the substrate, usually on which one or more layers have already been formed. General features of a conventional AF device 10 are shown in FIG. 11, in which the device is configured as a fringe-projection (FP) AF device. (See, e.g., U.S. Patent Application Publication No. 2012/0008150 A1.) The AF device 10 includes a sending unit 12 and a receiving unit 14. The sending unit 12 includes a source 16 of a beam 18 of AF light. The sending unit 12 directs the AF beam 18 to a diffraction grating 15. AF light from the diffraction grating 15 propagates to a first spatial filter 17 located at a pupil 22 of the sending unit 12. The first spatial filter 17 defines apertures that transmit selected diffraction order(s) (e.g., ±1 diffraction orders) of AF light while blocking other light. AF light from the sending unit 12 has a glancing angle of incidence on the substrate surface 20. The receiving unit 14 receives and detects (using a system photodetector 25) light of the AF beam 18 reflected from the substrate 20 and that reaches the receiving unit. Various other AF devices have respective configurations depending upon the particular characteristics of the AF light that are being exploited.

Further regarding FIG. 11, both the sending unit 12 and the receiving unit 14 have respective pupils 22, 24. Situated at the first pupil 22 is the first spatial filter 17. Situated at the second pupil 24 is a second spatial filter 26 that is configured to transmit selected diffraction orders (e.g., but not limited to, one or both the +1 and −1 orders) of interference fringes produced upstream. This selection of particular diffraction order(s) is made by defining aperture(s) in the second spatial filter 26 at locations at which the desired diffraction order(s) are incident on the filter under ideal conditions. As a result, the second spatial filter 26 transmits the selected diffraction order(s) through its aperture(s) while blocking transmission of other AF light, including divergent AF light. The selected diffraction order(s) passing through the respective aperture (s) contain phase and other information of the AF light 18. The transmitted diffraction order(s) are detected by a system photodetector 25, and the resulting data from the system photodetector 25 are used by a processor 27 (coupled to the system photodetector) to determine substrate height. No information is obtained concerning the AF light not transmitted by the second spatial filter 26.

According to various aspects of the current disclosure, at least some of the AF light that was diffracted, scattered, and/or refracted by the substrate (i.e., AF light not passing through the aperture(s) in the second spatial filter) is collected, desirably at or near the second pupil, and detected. This diffracted, scattered, and/or refracted light is termed "divergent" AF light. Data pertinent to the collected and detected divergent AF light are obtained and processed to provide useful infoiination about substrate-pattern contributions to the GH effect and other error-inducing phenomena. For example, unusually large signals of divergent light can be correlated with regions where GH effects are likely problematic.

Although this disclosure is set forth principally in the context of fringe-projection AF devices, it will be understood that any of various other AF devices alternatively can be used, such as but not limited to slit-projection AF devices. In any event, "divergent" AF light is intercepted at the second spatial filter or the like located at the pupil of the receiving unit. Interception can be performed using, for example, a second spatial filter similar in some respects to the second spatial filter used in conventional fringe-projection AF systems. In the context of such a spatial filter, most divergent AF light propagates in trajectories that do not result in passage through an aperture(s) of the second spatial filter. The intercepted divergent AF light is detected and used to assess GH and other effects on AF determinations, while non-divergent AF light passes normally through the aperture (s) of the second spatial filter and is detected downstream for use in determining and executing autofocus. In other words, whereas a conventional FP AF device detects only light passing through the aperture(s) of the second spatial filter, the various embodiments disclosed herein also detect AF light that otherwise would be blocked at these locations.

In various embodiments described below, filters, mirrors, and/or photodetectors are situated at particular locations in an AF-beam path to collect and detect at least some of the divergent AF light. But, the disclosure is not limited specifically to these embodiments; rather, the disclosure can be extended to various AF devices in which filters, mirrors, and/or detectors are similarly useful when placed in other locations in the AF beam path of the AF device.

Figure 1B:
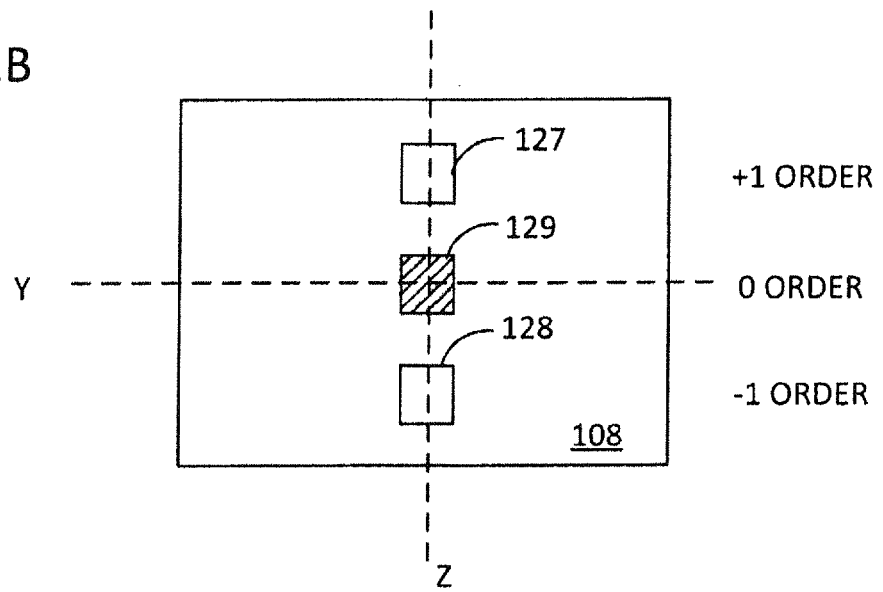
FIG. 1B is a plan schematic view of an exemplary first spatial filter, located upstream of the substrate, used in the embodiment of FIG. 1A.
Figure 1C:
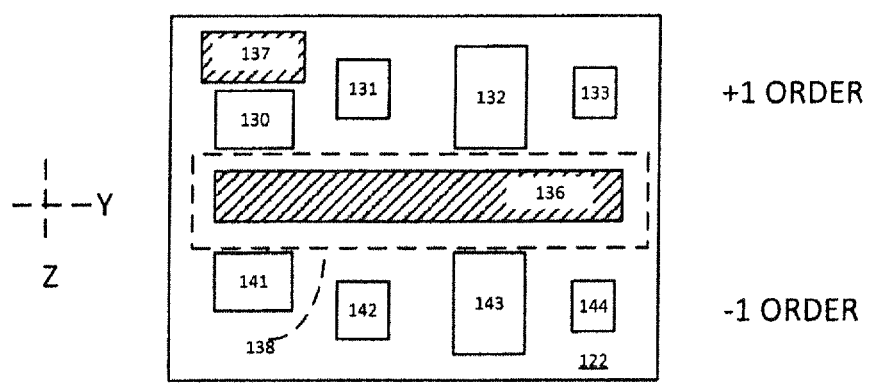
FIG. 1C is a plan schematic view of an exemplary second spatial filter, located downstream of the substrate, used in the embodiment of FIG. 1A.

A first representative embodiment is shown in FIGS. 1A-1C, which depicts features of a lithographic fringe-projection AF device configured with spatial filters and photodetectors associated therewith to collect and detect divergent AF light (or at least portions of AF light located outside the selected diffraction order(s) (e.g., at least one of the +1, −1 diffraction orders) used for normal autofocus. Referring to FIG. 1A, this embodiment includes a sending unit (fringe generator) 102 and a receiving unit (fringe detector) 120. The fringe generator 102 includes an optical radiation source 104 that produces and delivers an AF light beam to a diffraction grating 106. The diffracted beams produced by the diffraction grating 106 are focused at a first spatial filter 108 that is configured to transmit the selected diffraction orders (in this embodiment the ±1 diffraction orders) by allowing their passage through respective apertures 127, 128 (FIG. 1B), while blocking other diffraction orders. The selected diffraction orders 110 passing through the first spatial filter 108 are directed to the surface of a substrate 112 or other workpiece. AF light reflected from the substrate 112 propagates to the receiving unit 120. The receiving unit 120 includes a second spatial filter 122. The second spatial filter 120 is configured to transmit the selected diffraction orders while blocking other diffraction orders, as described below. Light passing through the spatial filter 122 propagates to a system photodetector 124.

FIG. 1B illustrates an exemplary first spatial filter 108. The first spatial filter 108 defines apertures 127, 128 situated to transmit, in this embodiment, the selected ±1 diffraction orders, respectively, of AF light and a region 129 situated to block or attenuate $0^{th}$ diffraction orders. Hence, substantially the only AF light passing through the first spatial filter 108 under ideal AF situations is $\pm 1^{st}$ order light; all other AF light is blocked by the first spatial filter.

FIG. 1C illustrates an exemplary second spatial filter 122. The second spatial filter 122 defines multiple apertures 130-133 that, in this embodiment, transmit +1 diffraction orders at each of four wavelengths, respectively, and multiple apertures 141-144 that transmit −1 diffraction orders at each of four wavelengths, respectively. (Four wavelengths are not required; the first spatial filter 108 can define more than four apertures for respective wavelengths or as few as one aperture for one respective wavelength.) On the surface of the second spatial filter 122 facing upstream, a region 138 defines no apertures. But, the region 138 is the site of a first additional photodetector 136 that detects light of other diffraction orders, as well as some divergent AF light, incident to it. A second additional photodetector 137 is situated on the same surface to receive other divergent AF light. The respective signals output from the first and second additional photodetectors 136, 137 (i.e., photocurrents or photovoltages associated with the particular AF light incident to them) can be amplified or buffered as required for utilization by a processor 147 to which the additional photodetectors are coupled. Also coupled to the processor 147 is the system photodetector 124, which produces signals corresponding to fringes incident thereon. The processor 147 can be configured, for example, to compare spatial and amplitude characteristics of data from all the photodetectors 124, 136, 137 and to correlate these characteristics to respective AF adjustments. During use of the lithography tool for performing pattern transfer, for example, divergent AF light having greater than normal amplitude at one or both additional photodetectors 136, 137, can indicate that the AF device may be producing inaccurate substrate-height data due to pattern effects, the GH effect, or other effects. In such instances, additional focus procedures can be invoked.

In other words, due to transmission of AF light through the upstream apertures 127, 128 of the first spatial filter 108, under ideal conditions (no adverse pattern-dependent, GH, or other effects) a certain maximum amplitude of AF light passes through one or more of the downstream apertures 130-133, 141-144 of the second spatial filter 122. As a result, correspondingly minimal amplitudes of AF light are detected by the additional photodetectors 136, 137. On the other hand, if the substrate has a region(s) exhibiting strong scattering, diffraction, and/or refraction of AF light due to pattern-dependent effects, these relative amplitudes likely change. The changes provide data from which appropriate correction can be identified and implemented.

The sizes and shapes of the additional photodetectors 136, 137 shown in FIG. 1C are not intended to be limiting. The first additional photodetector 136 can occupy all or a portion of the region 138. Similarly, the second additional photodetector 137 can occupy substantially all or a portion of the space between and adjacent the apertures 130-133 and 141-14. In addition, the additional photodetectors 136, 137 are not limited to one each; one or both may comprise multiple photodetectors. Also, the additional photodetectors 136, 137 may be respective imaging photodetectors.

Figure 2B:
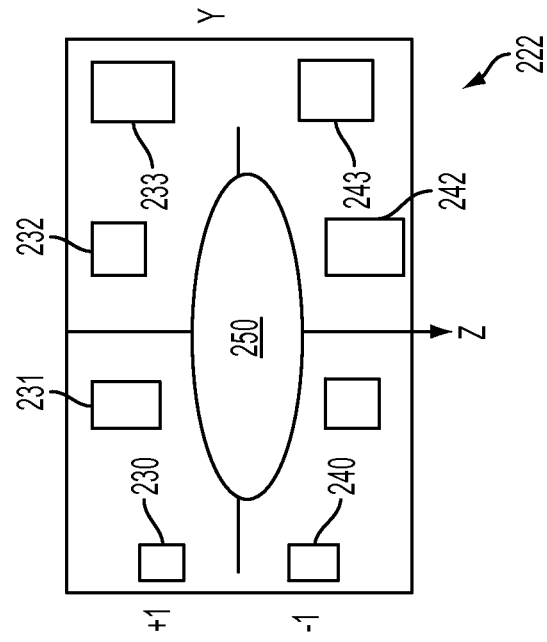
FIG. 2B is a plan schematic view of an exemplary second spatial filter used in the embodiment of FIG. 2A, the second spatial filter having an additional photodetector situated to detect divergent AF light from the substrate.
Figure 2A:
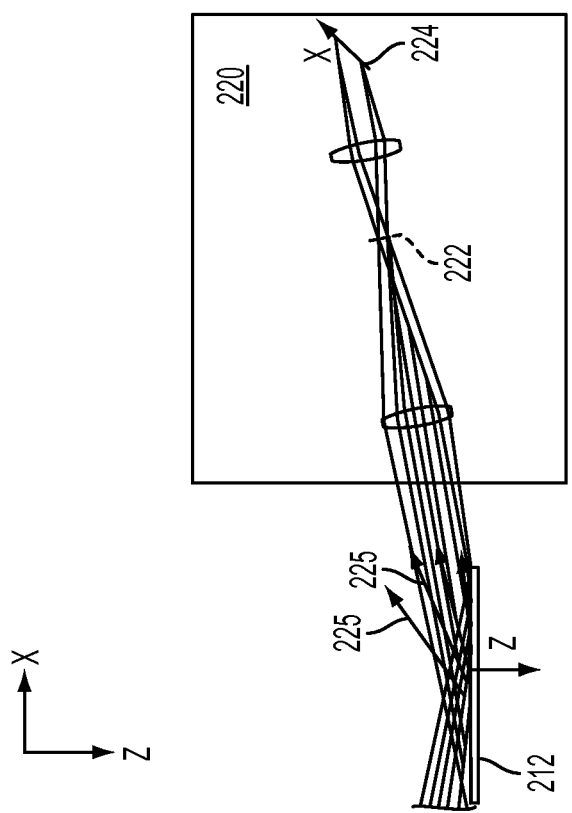
FIG. 2A is an optical diagram of a second representative embodiment of a fringe-projection AF device, in particular the portion downstream of the substrate.

FIG. 2A depicts the substrate 212 and receiving unit 220 of a second representative embodiment of a fringe-projection AF device. The receiving unit 220 includes a second spatial filter 222 configured to transmit selected diffraction orders (here, the ±1 diffraction orders) of the reflected AF beam at four different wavelengths via apertures 230-233 and 240-243, respectively. (Again, four wavelengths are not limiting; the second spatial filter 222 can be configured for a larger number of wavelengths or as few as one.) Pattern effects and/or thin-film effects on the substrate 212 can enhance the production of divergent AF light (arrows 225) that does not pass through the second spatial filter 222 and hence does not propagate to the system photodetector 224. On the second spatial filter 222, at least one additional photodetector 250 is situated to receive divergent AF light and possibly AF light of other diffraction orders (e.g., $0^{th}$ order AF light (FIG. 2B)) for detection of a condition presenting a higher than normal probability of AF errors.

Figure 3A:
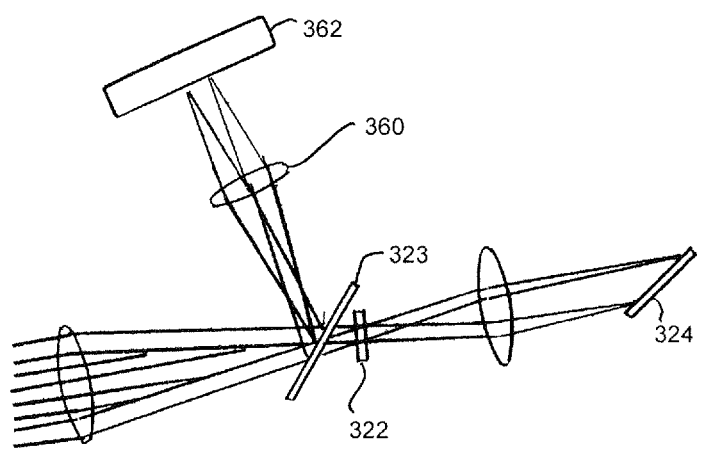
FIG. 3A is an optical diagram of a third representative embodiment of a fringe-projection AF device, in particular the portion downstream of the substrate, in which a planar reflector is situated proximate the second spatial filter and includes apertures corresponding to respective apertures defined on the second spatial filter.
Figure 3B:
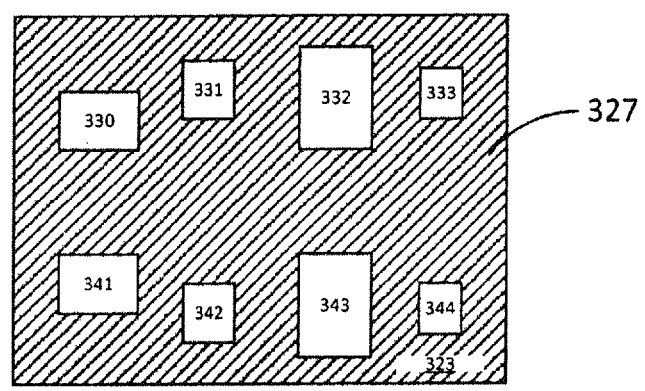
FIG. 3B is a plan schematic view of an exemplary second spatial filter used in the embodiment of FIG. 3A, the second spatial filter having one or multiple photodetectors situated in the region(s) excluding the apertures.

FIG. 3A depicts a third representative embodiment of an AF device that comprises a second spatial filter 322, a patterned reflector 323, and a system photodetector 324. The patterned reflector is useful whenever, as in this embodiment, the additional photodetectors are not located on or at the upstream-facing surface of the second spatial filter. Selected diffraction order(s) of AF light from the substrate (not shown but understood to be to the left of what is shown in FIG. 3A) propagate to the second spatial filter 322 through the patterned reflector 323. (By "patterned" is meant that the surface of the reflector 323 is not uniform; for example, in this embodiment the reflector surface defines at least one aperture configured to transmit selected diffraction order(s) of incident AF light.) Other AF light from the substrate is reflected by the patterned reflector 323 to a collection optical system 360, shown in FIG. 3 as a single lens, and to at least one additional photodetector 362 separate from the system photodetector 324. An exemplary configuration of the patterned reflector 323 is shown in FIG. 3B. The patterned reflector 323 defines apertures 330-333, 340-343 situated to transmit +1 and −1 diffraction orders, respectively, at respective wavelengths. The reflective surface 327 reflects other portions of AF light (including divergent AF light) to the collection optical system 360.

Figure 4:
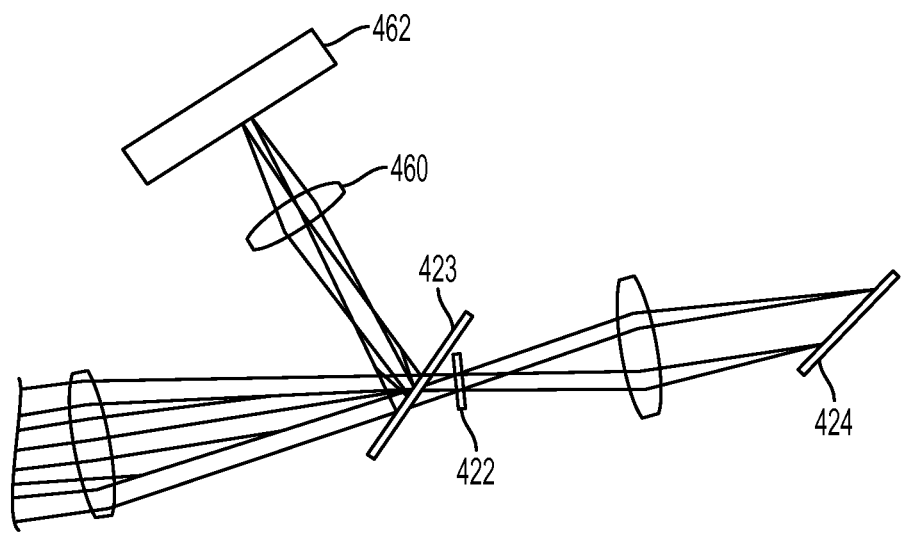
FIG. 4 is an optical diagram of a fourth representative embodiment of a fringe-projection AF device, in particular the portion downstream of the substrate, that is similar to the third embodiment but that utilizes an imaging photodetector.

An alternative configuration of the embodiment of FIGS. 3A and 3B is represented by the fourth representative embodiment shown in FIG. 4, depicting the receiving-end portion of an AF device. A patterned reflector 423 is situated on the input side of a second spatial filter 422. The patterned reflector 423 directs divergent AF light, propagating from the substrate, to collection optics 460 and an imaging detector 462, e.g., but not limited to a detector based on a focal-plane array. The patterned reflector 423 is similar to that of FIG. 3B. The patterned reflector 423 can be tilted as desired to direct light reflected therefrom for convenient placement of the collection optics 460 and detector 462. In some instances, the tilted reflector 423 can serve as a reflective spatial filter, allowing the second spatial filter 422 to be eliminated. AF light not reflected by the reflector 423 propagates to the system photodetector 424.

Figure 5:
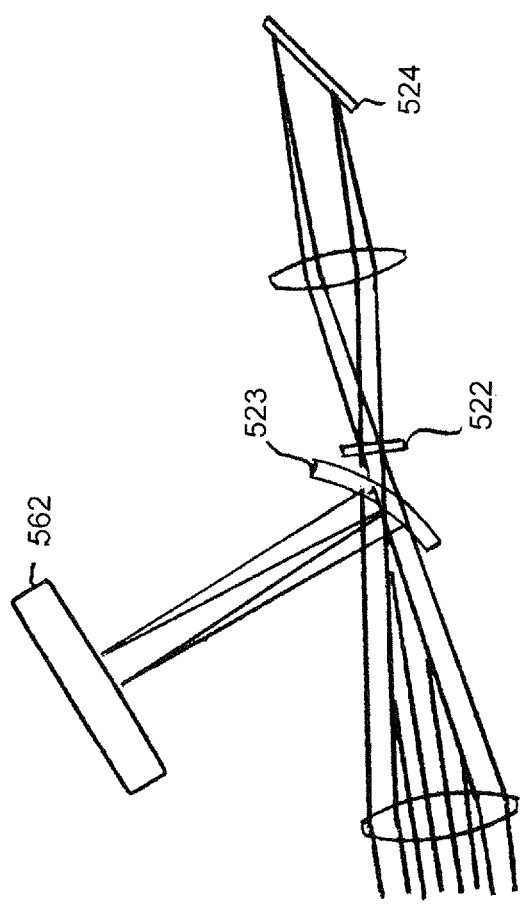
FIG. 5 is an optical diagram of a fifth representative embodiment of a fringe-projection AF device, in particular the portion downstream of the substrate, that is similar to the third embodiment but that includes a curved reflector situated proximate the second spatial filter. The curved reflector defines apertures corresponding to respective apertures on the second spatial filter.

FIG. 5 depicts a further alternative configuration of an AF device that utilizes a curved, patterned reflector 523 situated on the input side (upstream side) of a second spatial filter 522. The curved reflector 523 directs divergent AF light from the substrate to an additional photodetector 562, which can be an imaging or non-imaging detector. Even though the reflector 523 is not planar, it can be patterned as shown in FIG. 3B, for example. In alternative configurations, the curved reflector 523 can replace the second spatial filter 522. AF light not reflected by the curved reflector 523 propagates to the system photodetector 524.

Figure 6:
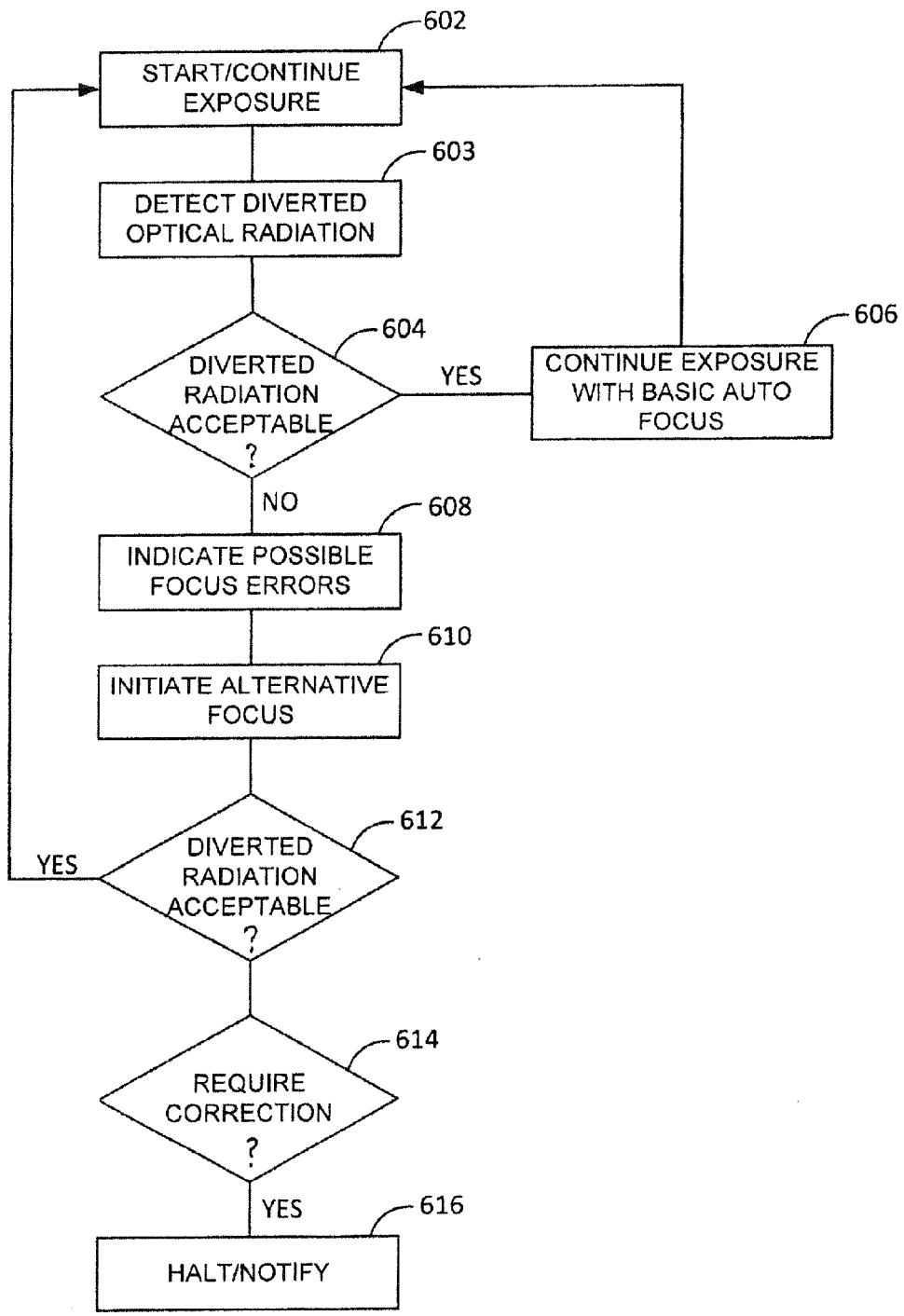
FIG. 6 is a block diagram of a representative embodiment of a method for identifying and compensating for autofocus errors.

FIG. 6 illustrates a representative embodiment of a method for detecting and correcting autofocus errors in a lithography tool. At 602, wafer exposure is initiated. Meanwhile, the AF device of the tool produces AF data concerning height of the substrate. The AF data includes data produced by normal ("non-divergent") AF light reflecting from the substrate surface in the absence of pattern effects, GH effects, and the like. The AF data may also include data produced by divergent AF light collected and detected as described above. Thus, at 603, divergent AF light in the AF device is detected. The divergent AF light comprises AF light that is scattered, diffracted, and/or refracted by the substrate in ways that result in, for example, a measurable shift in detected divergent AF light versus detected selected order(s) of diffracted AF light. The divergent AF light is detected by one or more photodetectors located at or near a spatial filter plane or by a remote detector to which the divergent light is directed. As described above, the divergent AF light generally is not transmitted by the second spatial filter. At 604 the detected amplitude of divergent AF light is evaluated. If the amplitude is within acceptable ranges, substrate exposure continues at 606. If the amplitude is unacceptable (typically too large), potential focus errors are flagged or recorded at 608. Alternative focus or autofocus approaches can be implemented at 610 (for example, using physical sensors). At 612, the amplitude of diverted AF light (as produced during the alternative focus) is evaluated. If it is within an acceptable range, autofocus and wafer exposure continue at 602. Otherwise, at 614 a determination is made of whether additional focus correction is required. If yes, at 616 exposure can be halted and parameters such as substrate locations associated with the unacceptable magnitude can be recorded.

For convenience, the foregoing embodiments are described in the context of fringe-projection systems such as any that are described in Smith and Goodwin, U.S. Patent Appl. Publ. No. 2012/0008150 A1, which is incorporated herein by reference. Other autofocus systems can be similarly equipped for detection of possible autofocus errors. For example, referring to FIGS. 7A-7B, a slit-projection autofocus device is shown. The device includes a light source 14 that is situated to produce and direct an AF beam to a surface 20a patterned with a slit or slits ("slit plate"). Lenses 22, 24 are situated so that the surface 20a is conjugate to a wafer surface 1a. A converging optical system 32, 34, 36 ensures that a surface 40a of a tilt-correcting prism 40 is conjugate to the wafer surface 1a. A slit plate 42 is situated at or near the conjugate surface 40a. As shown in FIGS. 7A-7B, the surfaces 20a, 1a, 40a are conjugate and satisfy the Scheimpflug condition so that a patterned image corresponding to the pattern surface 20a can be formed at surfaces 1a and 40a. Additional details of this autofocus system are provided in Mizutani, U.S. Pat. No. 5,602,399, which is incorporated herein by reference to the fullest extent allowed by law.

Further with respect to FIGS. 7A and 7B, diverted AF light is extracted by situating a patterned mirror 60 at or near the surface 40a of a transmissive slit plate 42. The patterned mirror 60 reflects the diverted AF light to collection optics 62 and to an additional photodetector 64 (not the system photodetector 50). Alternatively, the slit plate 42 can be reflective. Based on divergent AF light detected by the additional photodetector 64, the likelihood of an AF error can be evaluated, and additional focus methods instituted as needed. For example, the detected amplitude or other magnitude of AF light may indicate the presence of a GH effect or pattern-dependent effect that is adversely affecting the accuracy of the autofocus determination. From this information, appropriate corrections can be determined and executed. Specific areas of the substrate surface can be noted as problematic, and other AF-correction methods applied in those areas.

Based on diverted light fluxes as discussed above, one or more regions on a substrate can be identified at which additional calibrations, measurements, or calculations can be performed to improve autofocus. Alternatively, such areas can be flagged as requiring other autofocus approaches.

Figure 8:
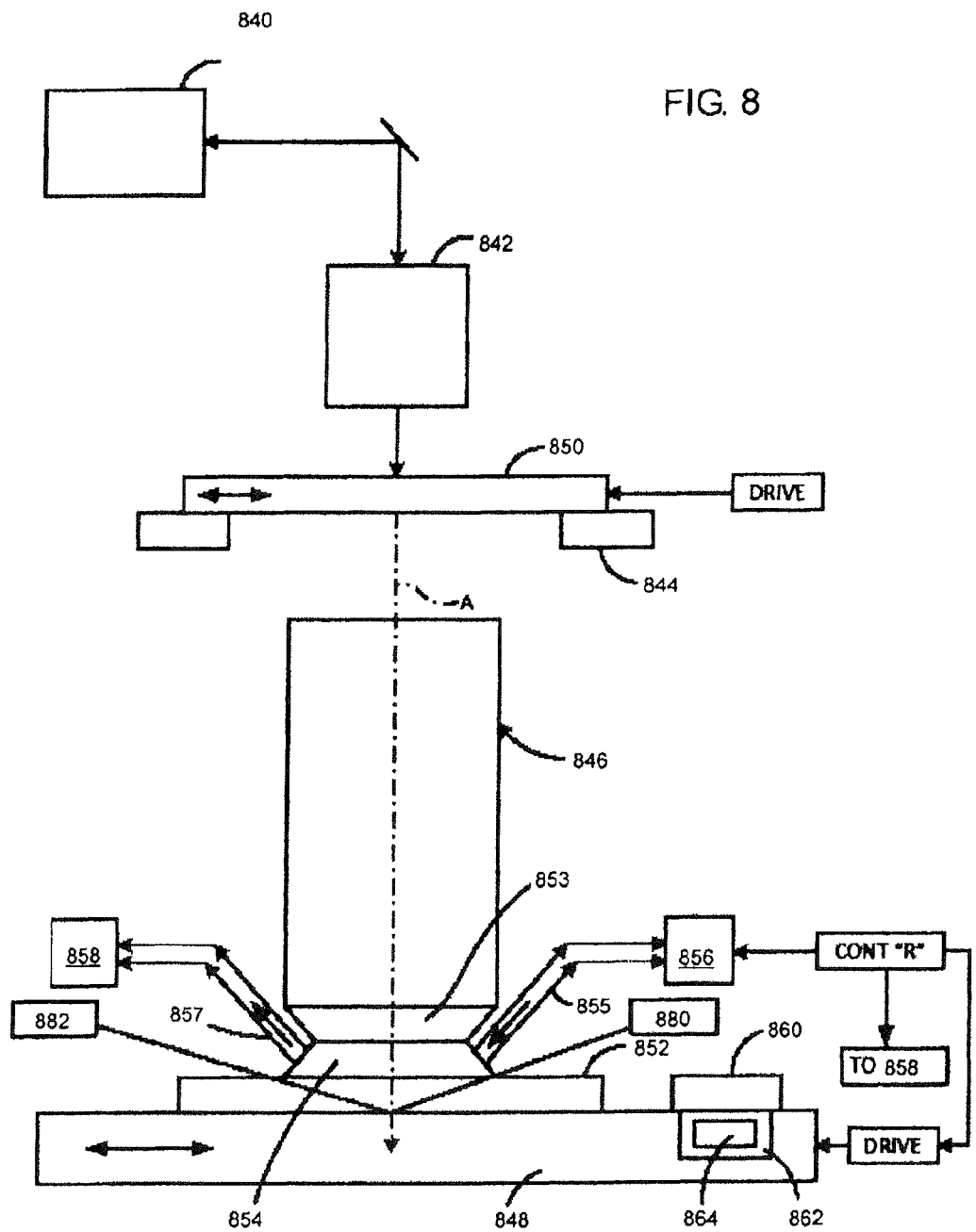
FIG. 8 is a schematic diagram of an embodiment of an immersion microlithography system, which includes an autofocus system as described herein.

The methods and apparatus disclosed above can be used in conjunction with various precision systems such as various types of lithography systems and other substrate-processing systems and methods. Turning to FIG. 8, certain features of an immersion lithography system (an exemplary precision system) are shown, namely, a light source 840, an illumination-optical system 842, a reticle stage 844, a projection-optical system 846, and a wafer (substrate) stage 848, all arranged along an optical axis A. The light source 840 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 842 includes an optical integrator and at least one lens that conditions and shapes the illumination beam for illumination of a specified region on a patterned reticle 850 mounted to the reticle stage 844. The pattern as defined on the reticle 850 corresponds to the pattern to be transferred lithographically to a wafer 852 that is held on the wafer stage 848. Lithographic transfer in this system is by projection of an aerial image of the pattern from the reticle 850 to the wafer 852 using the projection-optical system 846. The projection-optical system 846 typically comprises many individual optical elements (not detailed) that project the image at a specified demagnification ratio (e.g., 1/4 or 1/5) on the wafer 852. So as to be imprintable, the wafer surface is coated with a layer of a suitable exposure-sensitive material termed a "resist."

The reticle stage 844 is configured to move the reticle 850 at least in the X-direction, Y-direction, and rotationally about the Z-axis. To such end, the reticle stage is equipped with one or more linear motors having cooled coils as described herein. The two-dimensional position and orientation of the reticle 850 on the reticle stage 844 are detected by a laser interferometer or an encoder system (not shown) in real time, and positioning of the reticle 850 is effected by a main control unit on the basis of the detection thus made.

The substrate (e.g., semiconductor wafer) 852 is held by a substrate holder ("chuck," not shown) on the substrate stage 848. The substrate stage 848 includes a mechanism (not shown) for controlling and adjusting, as required, the focusing position (along the Z-axis) and the tilting angle of the substrate 852. The substrate stage 848 also includes electromagnetic actuators (e.g., linear motors or a planar motor, or both) for moving the substrate in the X-Y plane substantially parallel to the image-formation surface of the projection-optical system 846. These actuators desirably comprise linear motors, one more planar motors, or both.

The substrate stage 848 also includes mechanisms for adjusting the tilting angle of the substrate 852 by an auto-focusing and auto-leveling method. Thus, the substrate stage serves to align the substrate surface with the image surface of the projection-optical system. The two-dimensional position and orientation of the substrate are monitored in real time by another laser interferometer (not shown). Control data based on the results of this monitoring are transmitted from the main control unit to a drive circuits for driving the substrate stage. During exposure, the light passing through the projection-optical system is made to move in a sequential manner from one location to another on the substrate, according to the pattern on the reticle in a step-and-repeat or step-and-scan manner.

The projection-optical system 846 normally comprises many lens elements that work cooperatively to form the exposure image on the resist-coated surface of the substrate 852. For convenience, the most distal optical element (i.e., closest to the substrate surface) is an objective lens 853. Since the depicted system is an immersion lithography system, it includes an immersion liquid 854 situated between the objective lens 853 and the surface of the substrate 852. As discussed above, the immersion liquid 854 is of a specified type. The immersion liquid is present at least while the pattern image of the reticle is being exposed onto the substrate.

The immersion liquid 854 is provided from a liquid-supply unit 856 that may comprise a tank, a pump, and a temperature regulator (not individually shown). The liquid 854 is gently discharged by a nozzle mechanism 855 into the gap between the objective lens 853 and the substrate surface. A liquid-recovery system 858 includes a recovery nozzle 857 that removes liquid from the gap as the supply 856 provides fresh liquid 854. As a result, a substantially constant volume of continuously replaced immersion liquid 854 is provided between the objective lens 853 and the substrate surface. The temperature of the liquid is regulated to be approximately the same as the temperature inside the chamber in which the lithography system itself is situated.

Also shown is a sensor window 860 extending across a recess 862, defined in the substrate stage 848, in which a sensor 864 is located. Thus, the window 860 sequesters the sensor 864 in the recess 862. Movement of the substrate stage 848 so as to place the window 860 beneath the objective lens 853, with continuous replacement of the immersion fluid 854, allows a beam passing through the projection-optical system 846 to transmit through the immersion fluid and the window 860 to the sensor 864.

A fringe-projection system 880 is situated to project fringes to the substrate 852 and a reference surface, and a detection system 882 is configured to detect a portion of the fringe pattern. The detected beam can be used as described above to assess focus so that suitable system adjustments can be made to correct, prevent, or at least partially compensate focus shifts.

The present embodiment is also applicable to the AF sensor in liquid immersion type exposure apparatus, for example, as disclosed in U.S. Patent Application Publication No. 2011/0086315, incorporated herein by reference.

Furthermore, the above embodiments can also be used in combination with the AF sensor configured to reduce errors due to reflecting surfaces as disclosed, for example, in U.S. Patent Application Publication No. 2009/0116039, and U.S. Pat. No. 8,149,382, both being incorporated herein by reference. Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (which is also called a variable shaped mask, an active mask, or an image generator, and includes, for example, a DMD (Digital Micromirror Device). A DMD is a type of non-emission type image-display element (spatial light modulator or the like). On the DMD a light-transmitting pattern, a reflection pattern, or an emission pattern is formed according to electronic data of the pattern that is to be exposed. In the case of using such a variable shaped mask, a stage on which a workpiece (e.g., a wafer, a glass plate, or the like) is mounted is scanned relative to the variable shaped mask. The equivalent effect to the embodiment above can be obtained by measuring the position of this workpiece using the autofocus system.

Further, as disclosed in, for example, PCT International Publication No. 2001/035168, incorporated herein by reference, the embodiment described above can also be applied to an exposure apparatus (a lithography system) in which line-and-space patterns are formed on the wafer W by forming interference fringes on the substrate 110.

Moreover, the embodiment above can also be applied to an exposure apparatus that synthesizes two reticle patterns on a substrate via a projection optical system and substantially simultaneously performs double-exposure of one shot area on the substrate by one scanning exposure, as disclosed in, for example, U.S. Pat. No. 6,611,316, incorporated herein by reference.

The object or workpiece on which a pattern is to be formed (an object subject to exposure on which an energy beam is irradiated) in the embodiments described above is not limited to a wafer, but may be any of various other objects and workpieces such as a glass plate, a ceramic substrate, a film member, or a mask blank.

The usage of the exposure apparatus is not limited to the exposure apparatus used for manufacturing semiconductor devices. The embodiment above can also be applied widely to, for example, an exposure apparatus for manufacturing liquid-crystal display elements, in which a pattern for liquid-crystal display elements is transferred onto a rectangular glass plate, and to an exposure apparatus for manufacturing organic EL, thin-film magnetic heads, imaging devices (such as CCDs), micromachines, DNA chips or the like. The embodiment described above can also be applied to exposure apparatus that transfer a circuit pattern onto a glass substrate, a silicon wafer, or the like, not only for producing microdevices such as semiconductor devices, but also for producing a reticle or a mask used in an exposure apparatus such as an optical exposure apparatus, an EUV exposure apparatus, an X-ray exposure apparatus, or an electron-beam exposure apparatus.

The focus system and exposure apparatus according to the foregoing embodiments are manufactured by assembling various sub-systems containing their respective components, so as to maintain predetermined mechanical accuracy, electrical accuracy, and optical accuracy. For ensuring these various accuracies, the following adjustments are carried out before and after the assembling: adjustment for achieving the specified optical accuracy for various optical systems; adjustment for achieving the specified mechanical accuracy for various mechanical systems; and adjustments for achieving the specified electrical accuracy for various electrical systems. The assembling steps from the various subsystems into the exposure apparatus include mechanical connections, wire connections of electric circuits, conduit connections of pneumatic circuits, etc., between the various subsystems. The individual subsystems are assembled before performing assembling steps from the various subsystems into the exposure apparatus. After completing the assembly from the various subsystems into an exposure apparatus, overall adjustment is carried out to ensure various specified performance accuracies for the entire exposure apparatus. The manufacture of exposure apparatus is desirably performed in a clean room in which the temperature, cleanliness, etc., are controlled.

The respective disclosures of all publications, PCT International Publications, U.S. patent application Publications, and U.S. patents that are cited in the description so far related to exposure apparatus and the like are each incorporated herein by reference to the fullest extent allowed by law.

Figure 9:
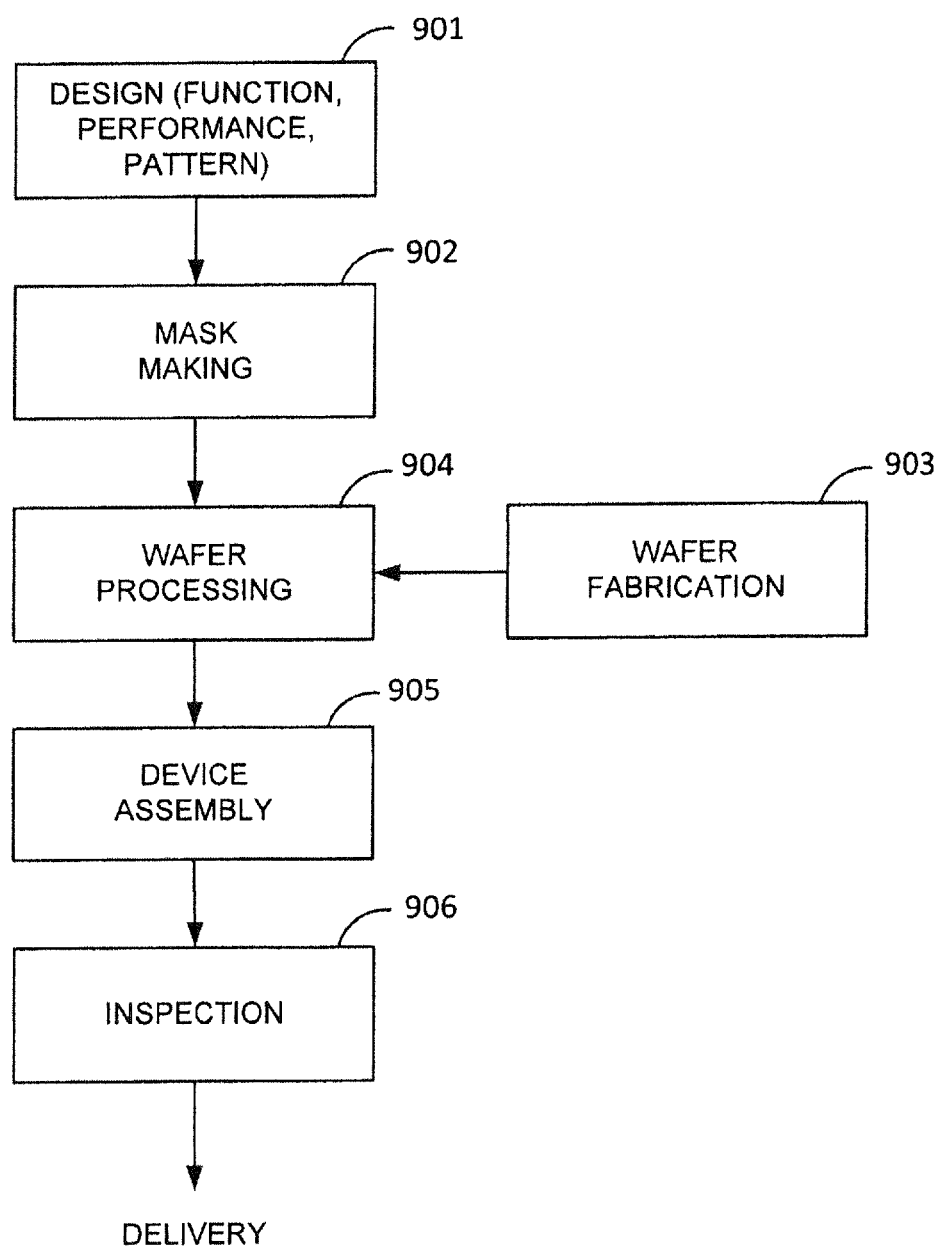
FIGS. 9-10 are schematic block diagrams of methods for device manufacturing.

An exemplary process for manufacturing semiconductor devices, including an exposure step, is shown in FIG. 9. Such methods can also include identification and correction of autofocus errors, as described above. In step 901 the device's function and performance characteristics are designed. Next, in step 902, a mask (reticle) having a desired pattern is designed according to the previous designing step, and in a parallel step 903 a wafer is made from a suitable semiconductor material. The mask pattern designed in step 902 is exposed onto the wafer from step 903 in step 904 by a microlithography system having an AF system such as disclosed herein. In step 905 the semiconductor device is assembled (including the dicing process, bonding process, and packaging process). Finally, the device is inspected in step 906.

Figure 10:
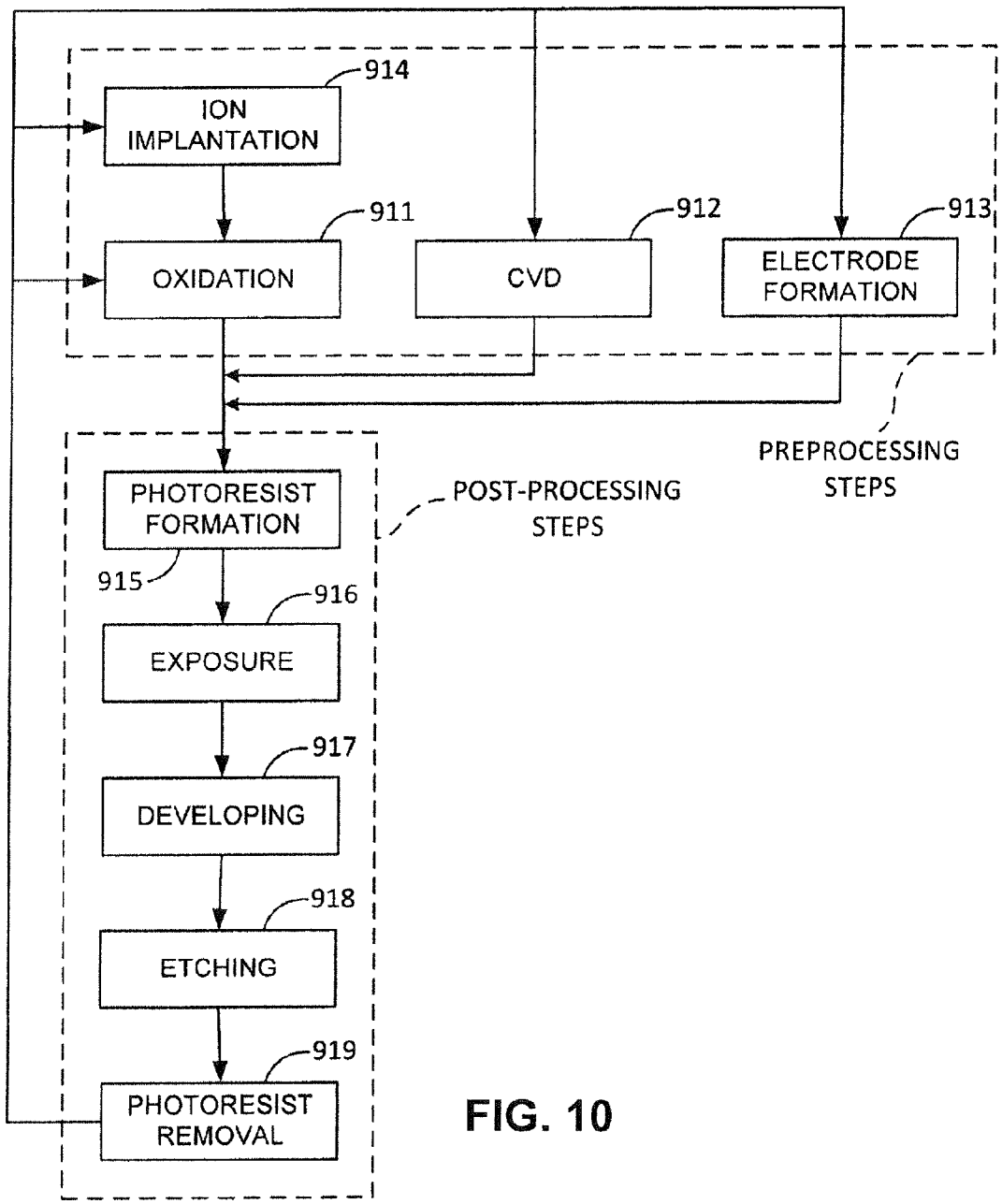

FIG. 10 is a flowchart of the above-mentioned step 904 in the case of fabricating semiconductor devices. In FIG. 10, in step 911 (oxidation step), the wafer surface is oxidized. In step 912 (CVD step), an insulation film is formed on the wafer surface. In step 913 (electrode-formation step), electrodes are formed on the wafer by vapor deposition. In step 914 (ion-implantation step), ions are implanted in the wafer. The above-mentioned steps 911-914 constitute the preprocessing steps for wafers during wafer processing, and selection is made at each step according to processing requirements.

At each stage of wafer processing, when the above-mentioned preprocessing steps have been completed, the following "post-processing" steps are implemented: First, in step 915 (photoresist-formation step), photoresist is applied to a wafer. Next, in step 916 (exposure step), the above-mentioned exposure device is used to transfer the circuit pattern of a mask (reticle) to a wafer. Then, in step 917 (developing step), the exposed wafer is developed, and in step 918 (etching step), parts other than residual photoresist (exposed material surface) are removed by etching. In step 919 (photoresist-removal step), unnecessary photoresist remaining after etching is removed. Multiple circuit patterns are formed by repeating these pre-processing and post-processing steps.

In view of the many possible embodiments to which the principles of the disclosure may be applied, it should be recognized that the illustrated embodiments are only preferred examples and should not be taken as limiting the scope of the invention.

I claim:

1. A surface position detecting system, comprising:
   a sending unit having a first spatial filter directing a light beam to a substrate; and
   a receiving unit comprising a system photodetector, a second spatial filter, and at least one additional photodetector, the second spatial filter receiving a light beam reflected from the substrate and dividing the received light beam into a selected first part that propagates to the system photodetector and a separate second part that propagates to the at least one additional photodetector, wherein the selected first part and the separate second part are of different diffraction orders from each other.

2. The system of claim 1, wherein the first part of the received light beam is regular reflected light from the substrate.

3. The system of claim 1, wherein the second part of the received light beam comprises divergent light coming from the substrate, the divergent light being at least one of reflected light, scattered light, diffracted light, or refracted light.

4. The system of claim 1, configured as a fringe-projection AF system or as a slit-projection AF system.

5. The system of claim 1, further comprising first and second pupils, wherein:
   the first pupil is located downstream of the substrate;
   the second pupil is located upstream of the substrate;
   the first spatial filter is located at the first pupil; and
   the second spatial filter is located at the second pupil.

6. The system of claim 1, wherein each of the first and second spatial filters defines one or more respective apertures arranged to transmit at least one selected diffraction order of light to the system photodetector.

7. The system of claim 6, wherein:
the first spatial filter defines respective apertures situated to transmit +1 and −1 diffraction orders, respectively, of light propagating to the substrate; and
the second spatial filter defines respective apertures situated to transmit +1 and −1 orders, respectively, of light reflected from the substrate.

8. The system of claim 6, wherein the at least one additional photodetector comprises a first additional photodetector situated on an upstream-facing surface of the second spatial filter to detect light of the selected diffraction order(s), and a second additional photodetector situated on the upstream-facing surface of the second spatial filter to detect light divergent from the selected diffraction order(s).

9. The system of claim 8, wherein:
the first spatial filter defines respective apertures situated to transmit +1 and −1 diffraction orders, respectively, of light propagating to the substrate; and
the second spatial filter defines respective apertures situated to transmit +1 and −1 orders, respectively, of light reflected from the substrate.

10. The system of claim 1, wherein the at least one additional photodetector comprises:
at least one first additional photodetector situated to detect a selected respective diffraction order light; and
at least one second additional photodetector situated to detect divergent light.

11. The system of claim 10, wherein the selected respective diffraction order of light comprises at least one of the +1 and −1 diffraction orders of light.

12. The system of claim 1, wherein the second spatial filter is reflective.

13. The system of claim 12, wherein:
the reflective optical element defines one or more apertures arranged to transmit at least one selected respective diffraction order of light reflected from the substrate; and
the reflective second spatial filter includes a surface situated to reflect divergent light.

14. The system of claim 13, wherein the apertures transmit +1 diffraction orders of light.

15. The system of claim 14, wherein the at least one additional photodetector is situated to detect incident divergent light.

16. The system of claim 13, wherein:
the reflective second spatial filter is planar; and
the system further comprises a refractive optical element situated between the reflective second spatial filter and the at least one additional photodetector.

17. The system of claim 4, wherein:
the receiving unit comprises a slit plate; and
the second spatial filter is situated upstream of the slit plate.

18. The system of claim 1, further comprising a controller coupled to the system photodetector and to the at least one additional photodetector, the controller being configured to compare respective signals from the photodetectors to determine whether the at least one additional photodetector is producing, relative to the system photodetector, a signal indicating an excessive divergent light flux.

19. A microlithography system, comprising a surface position detecting system as recited in claim 1.

20. A lithography tool, comprising:
an imaging optical system;
a substrate stage for holding a substrate relative to the imaging optical system; and
an autofocus (AF) device situated and configured to measure a height of the substrate relative to the imaging optical system, the AF device comprising a sending unit directing a light beam to a substrate, and including a first spatial filter situated upstream of the substrate and defining at least one respective aperture arranged to transmit at least one selected diffraction order of light, and a receiving unit comprising a system photodetector, a second spatial filter defining at least one respective aperture arranged to transmit the at least one selected diffraction order, and at least one additional photodetector, the second spatial filter receiving a light beam reflected from the substrate and dividing the received light beam into a selected first part that propagates to the system photodetector and a separate second part that propagates to the at least one additional photodetector, wherein the selected first part and the separate second part are of different diffraction orders from each other.

21. The lithography tool of claim 20, wherein the first part of the received light beam is regular reflected light from the substrate.

22. The lithography tool of claim 20, further comprising a controller coupled to the system photodetector and to the at least one additional photodetector, the controller being configured to compare respective signals from the photodetectors to determine whether the at least one additional photodetector is producing, relative to the system photodetector, a signal indicating an excessive divergent light flux.

23. The lithography tool of claim 20, wherein the AF device comprises a fringe-projection AF device.

24. The lithography tool of claim 20, wherein the at least one additional photodetector is arranged on the second spatial filter to detect divergent light.

25. The lithography tool of claim 20, wherein the autofocus device further comprises:
a first slit plate located upstream of and conjugate to the substrate; and
a second slit plate located downstream of the substrate and having a surface conjugate to the substrate, wherein the second spatial filter comprises a patterned mirror located sufficiently near the surface of the slit plate to be substantially conjugate to the substrate, the patterned mirror transmitting regular light while reflecting light including divergent light.

26. A microelectronic device produced by a fabrication process including a lithography step performed by the lithography tool recited in claim 20.

27. The system of claim 1, wherein each of the first part and the separate second part corresponds to a respective irradiated area on the substrate, and wherein the irradiated area of the selected first part and the irradiated area of the separate second part are different from each other.

28. The lithography tool of claim 20, wherein each of the first part and the separate second part corresponds to a respective irradiated area on the substrate, and wherein the irradiated area of the selected first part and the irradiated area of the separate second part are different from each other.

29. The surface position detecting system of claim 1, wherein the receiving unit further comprises a curved mirror.

* * * * *